United States Patent
Kim et al.

(10) Patent No.: US 9,802,276 B2
(45) Date of Patent: Oct. 31, 2017

(54) MANUFACTURING APPARATUS FOR MASK FRAME ASSEMBLY, AND METHOD USING THE SAME

(71) Applicant: Samsung Display Co., Ltd., Yongin-si (KR)

(72) Inventors: Myungkyu Kim, Yongin-si (KR); Jeongwon Han, Yongin-si (KR)

(73) Assignee: Samsung Display Co., Ltd., Yongin-si (KE)

( * ) Notice: Subject to any disclaimer, the term of this patent is extended or adjusted under 35 U.S.C. 154(b) by 0 days.

(21) Appl. No.: 15/043,866

(22) Filed: Feb. 15, 2016

(65) Prior Publication Data
US 2016/0322609 A1    Nov. 3, 2016

(30) Foreign Application Priority Data
Apr. 28, 2015  (KR) .......................... 10-2015-0059773

(51) Int. Cl.
*B23K 31/02*      (2006.01)
*B23K 37/04*      (2006.01)
*H01L 51/00*      (2006.01)

(52) U.S. Cl.
CPC .......... *B23K 37/0435* (2013.01); *B23K 31/02* (2013.01); *B23K 37/0408* (2013.01); *H01L 51/0011* (2013.01)

(58) Field of Classification Search
CPC .. B23K 37/0435; B23K 31/02; H01L 51/0011
See application file for complete search history.

(56) References Cited

U.S. PATENT DOCUMENTS

| | | | | |
|---|---|---|---|---|
| 2,991,542 | A * | 7/1961 | John ..................... | G01L 1/2287 228/185 |
| 3,724,740 | A * | 4/1973 | Imamura ............... | H01J 29/073 228/6.1 |
| 4,074,899 | A * | 2/1978 | Hochstetler ............ | B23P 11/00 269/249 |
| 4,478,589 | A * | 10/1984 | Takenaka ................ | H01J 9/142 228/191 |
| 4,802,410 | A * | 2/1989 | Ericsson ............ | B41F 15/0827 101/124 |
| 4,828,523 | A * | 5/1989 | Fendley .................. | H01J 9/142 219/121.63 |

(Continued)

FOREIGN PATENT DOCUMENTS

JP    2004022493 A  *  1/2004
KR    10-0741092        7/2007
(Continued)

*Primary Examiner* — Kiley Stoner
(74) *Attorney, Agent, or Firm* — H.C. Park & Associates, PLC

(57) ABSTRACT

Exemplary embodiments provide an apparatus to manufacture a mask frame assembly, including: extending unit configured to extend both ends of a mask in a first direction and arrange the mask on a frame, the mask including a deposition pattern and the frame including an opening; a pressurizing unit including a plurality of pressing portions the plurality of pressing portions configured to independently press the mask toward the frame; and a welding unit configured to weld the mask to affix the mask onto the frame.

13 Claims, 6 Drawing Sheets

(56) References Cited

U.S. PATENT DOCUMENTS

| | | | | |
|---|---|---|---|---|
| 4,828,524 A * | 5/1989 | Fendley | ............... | H01J 9/142 219/121.64 |
| 4,834,686 A * | 5/1989 | Kautz | ............... | H01J 9/142 219/121.64 |
| 4,916,793 A * | 4/1990 | Kuhn | ............... | B21D 1/14 228/119 |
| 5,013,275 A * | 5/1991 | Kautz | ............... | H01J 9/142 219/121.63 |
| 5,015,818 A * | 5/1991 | Kautz | ............... | B23K 26/16 219/121.63 |
| 5,090,670 A * | 2/1992 | Yang | ............... | B25B 5/003 269/249 |
| 5,113,611 A * | 5/1992 | Rosson | ............... | B44D 3/185 101/127.1 |
| 5,169,351 A * | 12/1992 | Choi | ............... | H01J 9/142 219/451.1 |
| 5,979,313 A * | 11/1999 | Fromm | ............... | B41F 15/36 101/127.1 |
| 6,280,276 B1 * | 8/2001 | Bucher | ............... | H01J 9/142 445/30 |
| 6,797,406 B2 * | 9/2004 | Matsudate | ............... | C22C 38/08 148/529 |
| 7,363,722 B1 * | 4/2008 | Brinkmoeller | ............... | E04F 21/1855 33/573 |
| 9,141,001 B2 * | 9/2015 | Kim | ............... | G03F 7/70733 |
| 9,507,273 B2 * | 11/2016 | Bucci | ............... | G03F 7/70733 |
| 9,567,662 B2 * | 2/2017 | Kim | ............... | C23C 14/042 |
| 9,581,917 B2 * | 2/2017 | Bucci | ............... | C23C 14/042 |
| 2001/0018309 A1 * | 8/2001 | Nishiki | ............... | H01J 9/142 445/30 |
| 2001/0030747 A1 * | 10/2001 | Hoover | ............... | G02B 7/16 356/400 |
| 2002/0081933 A1 * | 6/2002 | Wilbur, Jr. | ............... | B23K 37/0443 445/30 |
| 2002/0084315 A1 * | 7/2002 | MaCkay | ............... | B23K 1/0016 228/254 |
| 2004/0021410 A1 * | 2/2004 | Stagnitto | ............... | C23C 14/042 313/407 |
| 2004/0104197 A1 * | 6/2004 | Shigemura | ............... | C23C 14/042 216/20 |
| 2004/0110366 A1 * | 6/2004 | MacKay | ............... | B23K 1/0016 438/613 |
| 2004/0115342 A1 * | 6/2004 | Shigemura | ............... | H01L 51/0011 427/143 |
| 2005/0034810 A1 * | 2/2005 | Yamazaki | ............... | C23C 14/042 156/345.3 |
| 2005/0072359 A1 * | 4/2005 | Kim | ............... | C23C 14/042 118/720 |
| 2006/0012280 A1 * | 1/2006 | Kang | ............... | H01L 27/3211 313/310 |
| 2006/0012290 A1 * | 1/2006 | Kang | ............... | C23C 14/042 313/504 |
| 2006/0148368 A1 * | 7/2006 | Kang | ............... | C23C 14/042 445/47 |
| 2006/0158088 A1 * | 7/2006 | Kim | ............... | C23C 14/042 313/402 |
| 2007/0072337 A1 * | 3/2007 | Matsuzaki | ............... | C23C 14/042 438/99 |
| 2007/0108883 A1 * | 5/2007 | Finkel | ............... | H01J 29/003 313/479 |
| 2007/0190889 A1 * | 8/2007 | Lee | ............... | C23C 14/042 445/47 |
| 2008/0014035 A1 * | 1/2008 | Perkovich | ............... | B23B 47/281 408/1 R |
| 2009/0127236 A1 * | 5/2009 | Hong | ............... | G03F 7/12 219/121.64 |
| 2009/0159641 A1 * | 6/2009 | MacKay | ............... | B23K 35/22 228/41 |
| 2010/0112194 A1 * | 5/2010 | Inoue | ............... | C23C 14/042 427/66 |
| 2010/0273387 A1 * | 10/2010 | Inoue | ............... | C23C 14/042 445/58 |
| 2011/0146573 A1 * | 6/2011 | Park | ............... | C23C 14/042 118/712 |
| 2011/0157575 A1 * | 6/2011 | Lee | ............... | C23C 14/042 355/72 |
| 2011/0171768 A1 * | 7/2011 | Hong | ............... | C23C 14/042 438/34 |
| 2011/0207328 A1 * | 8/2011 | Speakman | ............... | H01L 51/0016 438/694 |
| 2012/0146064 A1 * | 6/2012 | Ishikawa | ............... | C23C 14/042 257/88 |
| 2012/0167822 A1 * | 7/2012 | Lee | ............... | C23C 14/042 118/504 |
| 2012/0174863 A1 * | 7/2012 | Park | ............... | C23C 14/042 118/504 |
| 2012/0181740 A1 * | 7/2012 | Eschlbeck | ............... | B65H 3/0816 271/91 |
| 2012/0183676 A1 * | 7/2012 | Sonoda | ............... | C23C 14/042 427/8 |
| 2012/0234235 A1 * | 9/2012 | Lee | ............... | C23C 14/042 118/504 |
| 2012/0279445 A1 * | 11/2012 | Kim | ............... | H01L 51/0011 118/504 |
| 2012/0282445 A1 * | 11/2012 | Kim | ............... | C23C 14/042 428/209 |
| 2013/0040047 A1 * | 2/2013 | Karaki | ............... | C23C 14/042 427/66 |
| 2013/0199445 A1 * | 8/2013 | Sonoda | ............... | H01L 51/0011 118/712 |
| 2013/0285038 A1 * | 10/2013 | Sonoda | ............... | C23C 14/042 257/40 |
| 2013/0299810 A1 * | 11/2013 | Sonoda | ............... | H01L 51/0011 257/40 |
| 2013/0318774 A1 | 12/2013 | Kang | | |
| 2014/0130735 A1 * | 5/2014 | Kim | ............... | H01L 51/0011 118/504 |
| 2014/0150721 A1 * | 6/2014 | Oh | ............... | C23C 14/042 118/504 |
| 2014/0165863 A1 * | 6/2014 | Han | ............... | B41F 15/0881 101/126 |
| 2014/0283742 A1 * | 9/2014 | Park | ............... | C23C 14/042 118/504 |
| 2014/0331925 A1 * | 11/2014 | Han | ............... | C23C 14/042 118/504 |
| 2014/0331926 A1 * | 11/2014 | Kim | ............... | B23K 37/0408 118/504 |
| 2015/0007767 A1 * | 1/2015 | Ko | ............... | B05B 15/0481 118/504 |
| 2015/0007768 A1 * | 1/2015 | Lee | ............... | C23C 14/042 118/504 |
| 2015/0014888 A1 * | 1/2015 | Oh | ............... | B23K 37/0408 264/400 |
| 2015/0017759 A1 * | 1/2015 | Hirobe | ............... | C23C 14/24 438/99 |
| 2015/0044930 A1 * | 2/2015 | Han | ............... | H01L 51/0011 445/3 |
| 2015/0050767 A1 * | 2/2015 | Kuriyama | ............... | C23C 14/042 438/34 |
| 2015/0068023 A1 * | 3/2015 | Han | ............... | H01L 51/56 29/592 |
| 2015/0114297 A1 * | 4/2015 | Kawato | ............... | C23C 14/24 118/726 |
| 2015/0159267 A1 * | 6/2015 | Ochi | ............... | C23C 14/042 118/721 |
| 2015/0246416 A1 * | 9/2015 | Mizumura | ............... | C23C 14/042 156/272.8 |
| 2015/0283651 A1 * | 10/2015 | Kudo | ............... | B23K 26/0869 264/400 |
| 2015/0328662 A1 * | 11/2015 | Mizumura | ............... | C23C 14/04 427/556 |
| 2016/0043319 A1 * | 2/2016 | White | ............... | G02B 26/02 359/230 |
| 2016/0047030 A1 * | 2/2016 | Obata | ............... | H01L 51/0011 438/99 |
| 2016/0084634 A1 * | 3/2016 | Yeon | ............... | G01N 21/94 356/630 |

(56) References Cited

U.S. PATENT DOCUMENTS

| | | | |
|---|---|---|---|
| 2016/0115580 A1* | 4/2016 | Mizumura | C23C 14/042 118/720 |
| 2016/0122860 A1* | 5/2016 | Kim | C23C 14/042 118/505 |
| 2016/0122861 A1* | 5/2016 | Kobayashi | C23C 14/044 118/720 |
| 2016/0126507 A1* | 5/2016 | Ko | C23C 14/042 438/34 |
| 2016/0167083 A1* | 6/2016 | Kim | B05B 15/045 118/504 |
| 2016/0168691 A1* | 6/2016 | Takeda | H01L 27/3211 118/504 |
| 2016/0201185 A1* | 7/2016 | Bai | B23K 31/02 118/720 |
| 2016/0260935 A1* | 9/2016 | Lee | C23C 14/042 |
| 2016/0301006 A1* | 10/2016 | Obata | H01L 51/0011 |
| 2016/0308131 A1* | 10/2016 | Kobayashi | C23C 14/54 |
| 2016/0322609 A1* | 11/2016 | Kim | B23K 31/02 |
| 2016/0359145 A1* | 12/2016 | Kuang | H01L 51/56 |
| 2016/0369392 A1* | 12/2016 | Kim | B23K 11/11 |
| 2017/0001259 A1* | 1/2017 | Han | B23K 26/21 |
| 2017/0095827 A1* | 4/2017 | Monto | C23C 14/042 |

FOREIGN PATENT DOCUMENTS

| | | |
|---|---|---|
| KR | 10-1094822 | 12/2011 |
| KR | 10-1238000 | 3/2013 |
| KR | 10-2013-0134707 | 12/2013 |

* cited by examiner

9,802,276 B2

MANUFACTURING APPARATUS FOR MASK FRAME ASSEMBLY, AND METHOD USING THE SAME

CROSS-REFERENCE TO RELATED APPLICATION

This application claims priority from and the benefit of Korean Patent Application No. 10-2015-0059773, filed on Apr. 28, 2015, which is hereby incorporated by reference for all purposes as if fully set forth herein.

BACKGROUND

Field

Exemplary embodiments relate to an apparatus for manufacturing a mask frame assembly, and a method for manufacturing a mask frame assembly using the same.

Discussion of the Background

Mobile electronic apparatuses have been widely used. A mobile electronics apparatus includes a small-sized electronic apparatus, such as a mobile phone, and a tablet portable computer.

Such a mobile electronic apparatus provides various functions, and includes a display apparatus to provide a user with visual information such as an image (still/moving image). According to reducing size of components for driving the display apparatus, the display apparatus forms relatively greater portion of the electronic apparatus, and has been developed to have a bendable structure so that the display apparatus may be bent at an angle from a flat state.

The above information disclosed in this Background section is only for enhancement of understanding of the background of the inventive concept, and, therefore, it may contain information that does not form the prior art that is already known in this country to a person of ordinary skill in the art.

SUMMARY

Exemplary embodiments provide a manufacturing apparatus for a mask frame assembly, and a method of manufacturing a mask frame assembly using the manufacturing apparatus.

Additional aspects will be set forth in the detailed description which follows, and, in part, will be apparent from the disclosure, or may be learned by practice of the inventive concept.

An exemplary embodiment discloses an apparatus to manufacture a mask frame assembly, including: extending unit configured to extend both ends of a mask in a first direction and arrange the mask on a frame, the mask including a deposition pattern and the frame including an opening; a pressurizing unit including a plurality of pressing portions the plurality of pressing portions configured to independently press the mask toward the frame; and a welding unit configured to weld the mask to affix the mask onto the frame.

An exemplary embodiment discloses an apparatus to manufacture a mask frame assembly, including: an extending unit configured to extend both ends of a mask in a first direction and arrange the mask on a frame, the mask including a deposition pattern and the frame including an opening; a gap measuring unit configured to measure a gap between the mask and the frame; a pressurizing unit configured to apply different amounts of force to the mask in response to the gap measured by the gap measuring unit; and a welding unit configured to weld the mask to affix the mask onto the frame.

An exemplary embodiment also discloses a method of manufacturing a mask frame assembly, including: extending both ends of a mask in a first direction using an extension unit, the mask including a deposition pattern; arranging the mask on a frame, the frame including an opening; measuring a gap between the mask and the frame using a gap measuring unit; applying different amounts of force to the mask using a pressurizing unit in response to the gap between the mask and the frame to adhere the mask closely to the frame; and welding the mask onto the frame using a welding unit to affix the mask and the frame.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concept, and are incorporated in and constitute a part of this specification, illustrate exemplary embodiments of the inventive concept, and, together with the description, serve to explain principles of the inventive concept.

DETAILED DESCRIPTION OF THE ILLUSTRATED EMBODIMENTS

Figure 1:
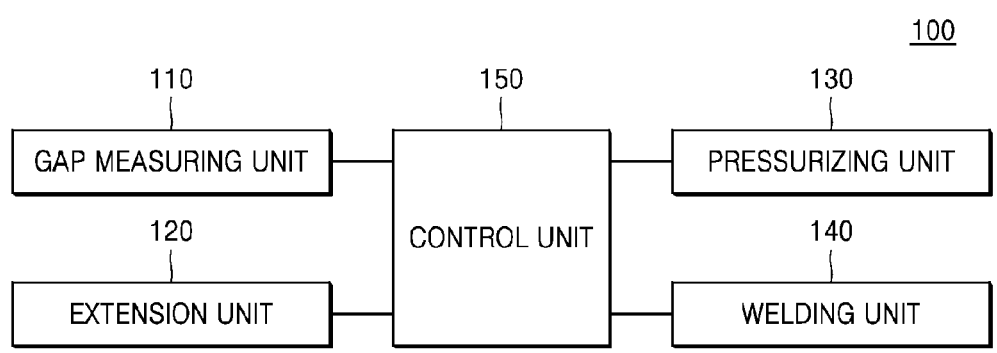
FIG. 1 is a block diagram illustrating a manufacturing apparatus for a mask frame assembly according to an exemplary embodiment.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the present disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Figure 2:
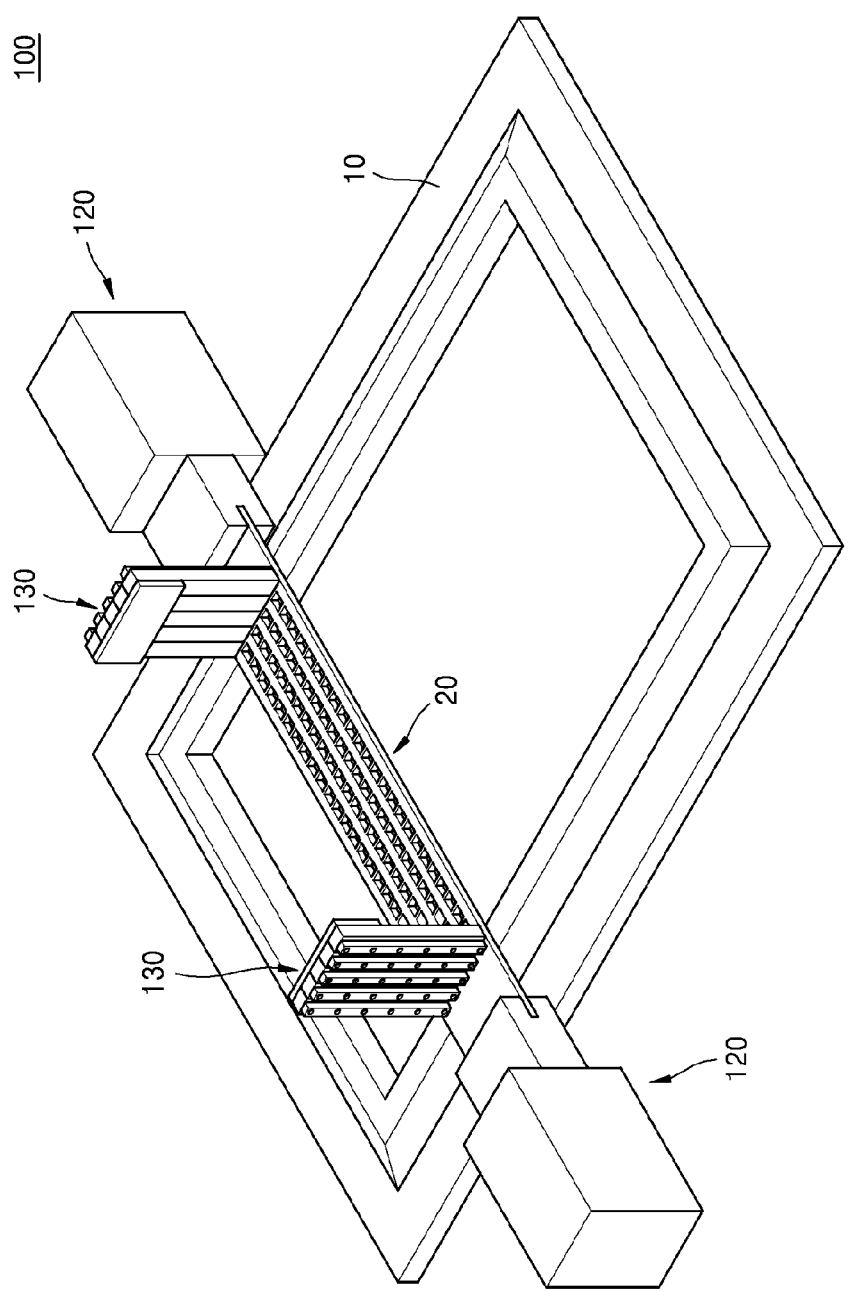
FIG. 2 is a perspective view illustrating the manufacturing apparatus of FIG. 1, according to an exemplary embodiment.

FIG. 1 is a block diagram illustrating an apparatus 100 for manufacture a mask frame assembly according to an exemplary embodiment, and FIG. 2 is a prospective view illustrating the apparatus 100 of FIG. 1, according to an exemplary embodiment. Hereinafter, the apparatus 100 for manufacture the mask frame assembly may be referred to as a manufacturing apparatus 100. Referring to FIG. 1 and FIG. 2, the manufacturing apparatus 100 may include a gap measuring unit 110, an extending unit 120, a pressurizing unit 130, a welding unit 140, and a control unit 150. The manufacturing apparatus 100 may affix a mask 20 to a frame 10. The mask 20 may include one or more deposition patterns.

The frame 10 may include an opening through which a deposition material may pass, and a support formed surrounding the opening. The support may define the opening. The frame 10 may be formed using a metal and/or a composite resin. Although the exemplary embodiment of FIG. 2 illustrates that the frame 10 may have a rectangular shape including one or more openings, the exemplary embodiments are not limited thereto. The frame 10 may have various shapes including a circle and a polygon including a hexagon. For the purpose of descriptions, the frame 10 including four supports connected to form a rectangular shape will be illustrated hereinafter.

The mask 20 may be formed of a single member to be coupled to the frame 10. The mask 20 may also be formed of a plurality of stick shape members to distribute a weight of the mask 20. For the purpose of descriptions, the mask 20 having stick shape members will be illustrated hereinafter.

The gap measuring unit 110 may measure a gap that may be formed between the frame 10 and the mask 20. A gap may be formed between the frame 10 and the mask 20 by surfaces of the mask 20 and the frame 10. That is, the gap may be formed between the frame 10 and the mask 20 due to shapes of the lower surface of the mask 20 and the upper surface of the frame 10.

The gap measuring unit 110 may radiate light, such as a laser beam, to measure the gap between the frame 10 and the mask 20. In detail, the gap measuring unit 110 may be installed or disposed above an area in which the frame 10 is disposed contacting the mask 20. The gap measuring unit 110 may measure the gap between the frame 10 and the mask 20 from a path difference of the lights respectively reflected from the surface of the frame 10 or the surface of the mask 20.

The manufacturing apparatus 100 may include a plurality of gap measuring units 110 to calculate a plurality of gap data at respective positions. Also, the gap measuring unit 110 may be installed to move along the frame 10 to continuously measure the gap between the frame 10 and the mask 20. The gap measuring unit 110 may measure a plurality of gaps between the frame 10 and the mask 20 at an area in which the pressurizing unit 130 presses the mask 20 toward the frame 10.

The gap measuring unit 110 may be connected to the control unit 150. The gap measuring unit 110 may transmit measured gap data to the control unit 150, and the control unit 150 may calculate an amount of force (or pressure) applied to the mask 20 according to the gap data. The control unit 150 may calculate the amount of pressure applied to the mask 20 to remove or reduce the gap between the frame 10 and the mask 20.

The extending unit 120 may extend (or stretch) both ends of the mask 20, which includes the one or more deposition patterns, in a first direction corresponding to a longitude (lengthwise) direction of the mask 20. The extending unit 120 may arrange or align the mask 20 with respect to the frame 10 so that the deposition patterns are disposed corresponding to the opening of the frame 10.

The mask 20 may be formed as a thin mask to increased precision of the deposition patterns. When a thickness of the mask 20 decreases, the precision deposition patterns may be increased, but a deposition precision may be decreased due to sagging and wrinkle of the mask 20 from the decreased thickness. The extending unit 120 may extend (or stretch) the mask 20 in the first direction before the extended mask 20 is arranged on the frame 10 to prevent or reduce the sagging and wrinkle of the mask 20.

Figure 3:
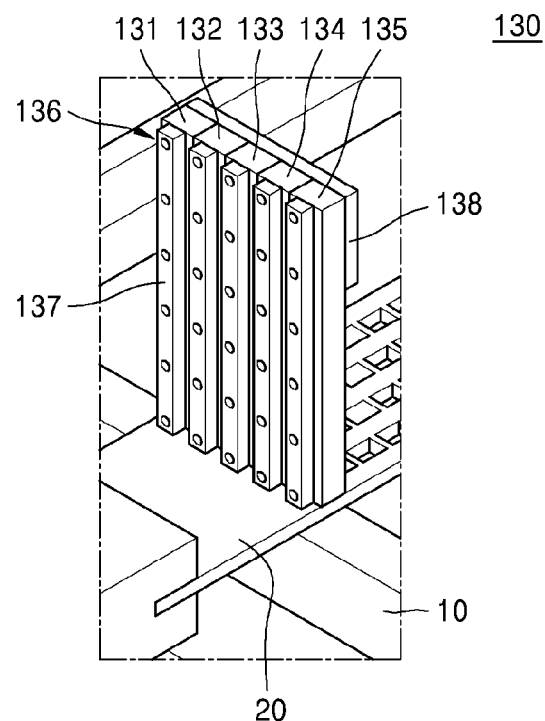
FIG. 3 is an enlarged view illustrating a pressurizing unit of FIG. 2, according to an exemplary embodiment.

FIG. 3 is an enlarged view illustrating the pressurizing unit 130 of FIG. 2, according to an exemplary embodiment. Referring to FIG. 3, the pressurizing unit 130 may include a plurality of pressing portions 136, a connecting portion 137, and a driving portion 138.

The pressing portions 136 may be polygonal columns or circular columns continuously arranged. The pressing portions 136 may apply a force to an edge area of the mask 20 in a second direction. The first direction and the second direction may be substantially perpendicular to each other. The pressing portions 136 may include, but not limited to, ceramic, glass, polymer, etc.

The pressing portions 136 may be formed in plural to receive a drive force from the driving portion 138. The number of the pressing portions 136 is not limited to a particular number, and may be formed in plural according to a size of the mask 20. For the purpose of description, the pressing portions 136 according to the exemplary embodiment illustrated in FIG. 3 includes a first pressing portion 131, a second pressing portion 132, a third pressing portion 133, a fourth pressing portion 134, and a fifth pressing portion 135 hereinafter.

The driving portion 138 may include a plurality of driving portions 138, and the pressing portions 136 may respectively receive the driving forces from the plurality of driving portions 138. The first to fifth pressing portions 131 to 135 may be connected to the respective driving portions 138 to receive the respective driving forces from the corresponding driving portions 138. If the driving portion 138 includes a single driving portion 138, the first to fifth pressing portions 131 to 135 may be connected to the single driving portion 138 to receive the respective driving force from the single driving portion 138.

In response to the received driving forces, the plurality of pressing portions 136 may generate a linear motion to apply force to the mask 20 toward the frame 10 such that the mask 20 may closely contact the frame 10 (or the mask 20 may adhere closely to the frame 10).

The pressing portion 136 may apply different forces to the mask according to the positions at which the mask 20 contacts the frame 10. The first to fifth pressing portions 131 to 135 may apply different amounts of force to the mask 20 according to gaps between the frame 10 and the mask 20, and minimize or reduce the gaps between the frame 10 and the mask 20.

The pressing portions 136 may apply the different amounts of force to the mask 20 to remove or reduce the gaps between the frame 10 and the mask 20. The driving portion 138 may control an amount of force applied to the mask 20 by the first to fifth pressing portions 131 to 135, according to the amount of force received from the control unit 150.

Figure 8:
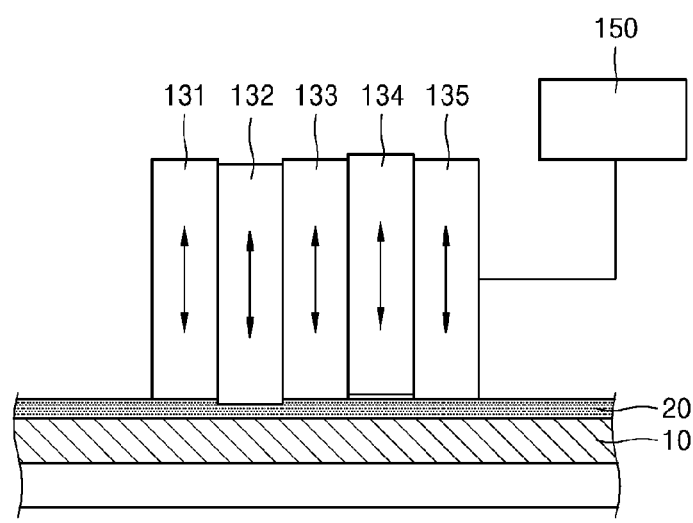

Referring to FIG. 8, the driving portion 138 (see FIG. 3) may independently move the first to fifth pressing portions 131 to 135 in a linear motion to press the mask 20 toward the frame 10 such that the mask 20 may closely contact the frame 10. For example, the first pressing portion 131, the third pressing portion 133, and the fifth pressing portion 135 may apply a first force to corresponding areas of the mask 20 disposed below the first, third, and fifth pressing portions 131, 133, and 135 to remove or reduce gaps between the frame 10 and the mask 20. The second pressing portion 132 may apply a second force to a corresponding area of the mask disposed below the second pressing portion 132 to remove or reduce a gap between the frame 10 and the mask 20. The first force may be different from the second force. Also, when the frame 10 and the mask 20 closely contact each other, the fourth pressing portion 134 may be moved such that a force is not applied to the mask 20.

The driving portion 138 may transfer the driving forces to the first to fifth pressing portions 131 to 135. The driving portion 138 may include an actuator, a pneumatic cylinder, a hydraulic cylinder, a piston, and/or a spring to transfer the driving forces to the respective first to fifth pressing portions 131 to 135. The driving portion 138 may include an elastic member having an elastic characteristic (or elastic force) which may be controlled to transfer the driving forces to the respective first to fifth pressing portions 131 to 135. However, the exemplary embodiments are not limited thereto. Various apparatuses may be used to transfer the driving forces to the pressing portions 136.

The connecting portion 137 may connect the driving portion 138 and the pressing portions 136. The connecting portion 137 may be installed in a lengthwise direction of the pressing portions 136 and linearly move the pressing portions 136 in the second direction by ascending and descending with respect to the mask 20.

Figure 7:
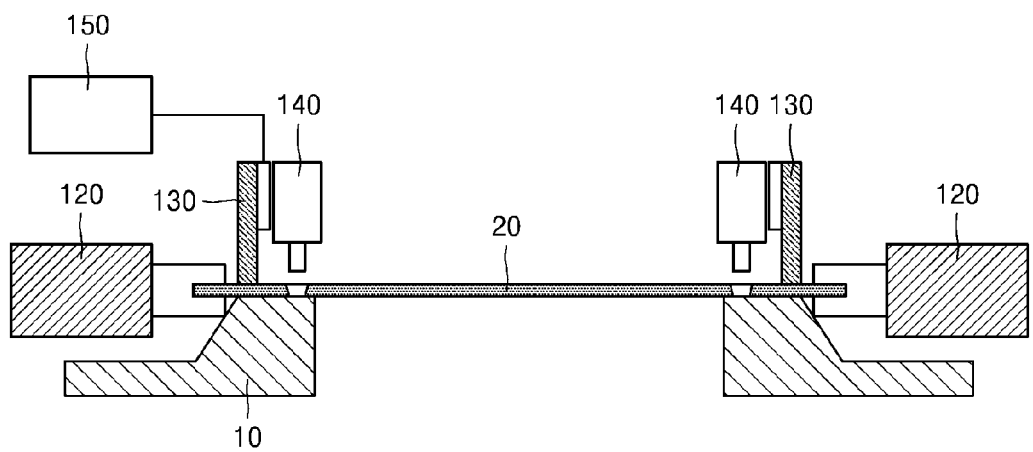

Referring back to FIG. 1 and FIG. 2, the welding unit 140 may weld the mask 20 to affix the mask 20 to the frame 10. The welding unit 140 may be disposed adjacent to the pressurizing unit 130. For example, referring to FIG. 7, the welding unit 140 may weld the mask 20 at an inside of the pressurizing unit 130.

The mask 20 is formed flat in the first direction by the extending unit 120, and the pressurizing unit 130 applies a force toward the mask 20 (or presses the mask 20 toward the frame 10) in the second direction to remove or reduce the gap between the frame 10 and the mask 20. Thereafter, the welding unit 140 welds the mask 20 to the frame 10 at the inside of the pressurizing unit 130 to affix the mask 20 to the frame 10 while the mask 20 is maintained flat in the first and second directions, closely contacting the frame 10.

The control unit 150 is connected to the gap measuring unit 110 and receives gap data, corresponding to the gap between the frame 10 and the mask 20, from the gap measuring unit 110. The control unit 150 may calculate (or generate) an amount of force applied to the mask 20 by the pressurizing unit 130, according to the received gap data. The control unit 150 may control the driving portion 138 such that the pressurizing unit 130 applies the amount of force calculated by the control unit 150 to the mask 20.

Figure 4:
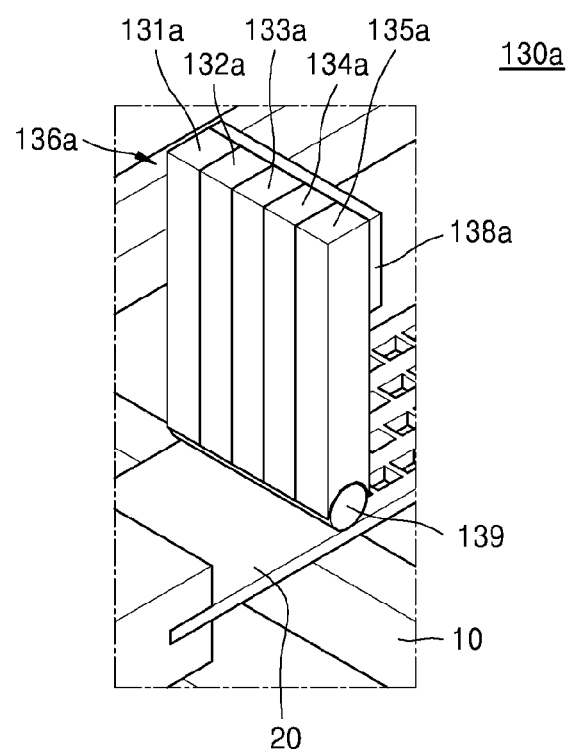
FIG. 4 is an enlarged view illustrating a pressurizing unit of a manufacturing apparatus for a mask frame assembly according to an exemplary embodiment.
Figure 5:
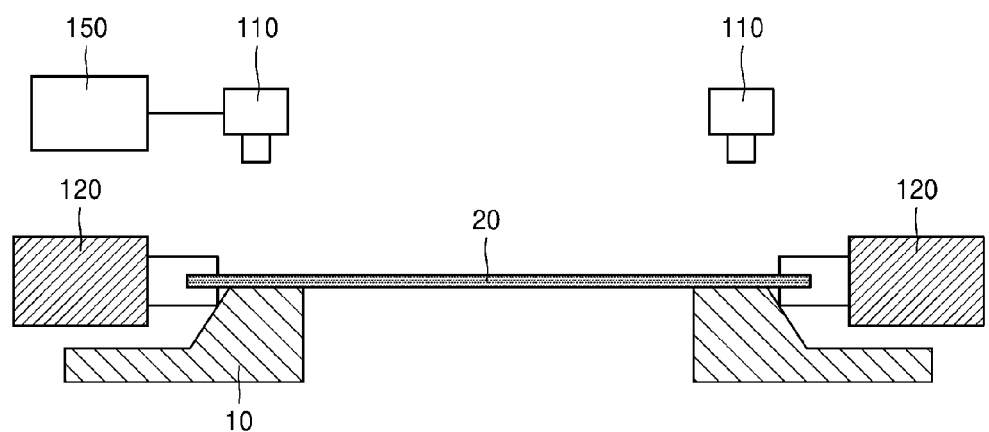
FIG. 5, FIG. 6, FIG. 7, and FIG. 8 are cross-sectional views illustrating a method of manufacturing a mask frame assembly according to an exemplary embodiment.
Figure 6:
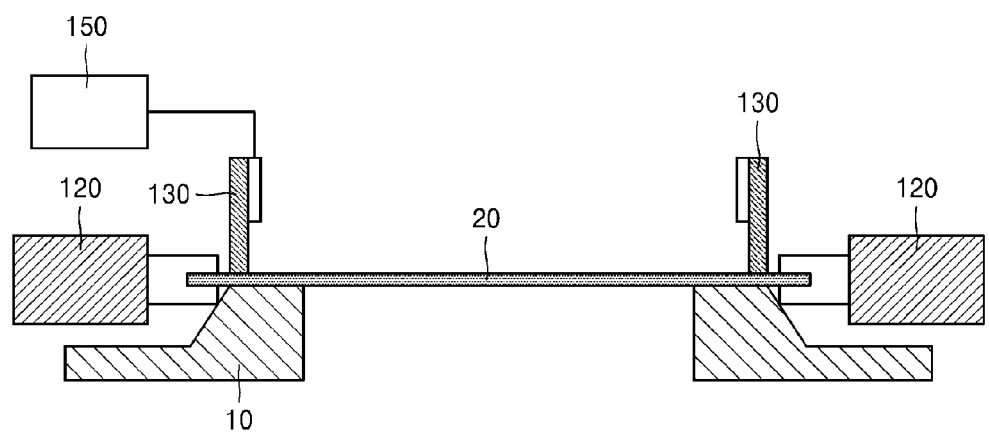

FIG. 4 is an enlarged view illustrating a pressurizing unit 130a according to an exemplary embodiment. Referring to FIG. 4, the pressurizing unit 130a may include a plurality of pressing portions 136a, a driving portion 138a, and a head portion 139. The plurality of pressing portions 136a and the driving portion 138a of the pressurizing unit 130a of the pressurizing unit 130a may be the same or similar to the plurality of pressing portions 136 and the driving portion 138 of the pressurizing unit 130 as illustrated in FIG. 2. Accordingly, detail descriptions of the plurality of pressing portions 136a and the driving portion 138a of the pressurizing unit 130a of the pressurizing unit 130a will be omitted.

The head portion 139 may be connected to the plurality of pressing portions 136a and may contact the mask 20. The driving portion 138a may control the amount of force applied to the mask 20 by the head portion 139, by independently controlling the plurality of pressing portions 136a.

The head portion 139 may be disposed at respective end portions of a first pressing portion 131a, a second pressing portion 132a, a third pressing portion 133a, a fourth pressing portion 134a, and a fifth pressing portion 135a to apply a force to the mask 20 according to a movement of the first to fifth pressing portions 131a to 135a. That is, the head portion 139 may apply a force to the mask 20 according to a movement of the pressing portions connected to the head portion 139, respectively. The head portion 139 may control the amount of force applied to the mask 20 according to a contact area between the head portion 139 and the mask 20.

The head portion 139 may be a single body installed to be connected to lower end portions of the first to fifth pressing portions 131a to 135a. The head portion 139 may apply a force to the mask 20 according to a movement of at least one of the first to fifth pressing portions 131a to 135a. The head portion 139 may be formed in a single body according to a size (or dimension) of the mask 20 to continuously distribute the force to the mask 20. In detail, when one of the plurality of the pressing portions 136a moves to apply force to the head portion 139, a greater amount of force may be applied at a lower end of the moved one of the pressing portions 136a, and the applied force may be gradually decreased away from both sides of the lower end of the moved one of the pressing portions 136a. The force formed on the head portion 139 may be continuously distributed so that deformation of the mask 20 contacting the head portion 139 may be minimized or reduced.

The head portion 139 may have a roller shape having a curved area to apply the force to the mask 20. The gap between the frame 10 and the mask 20 may not be uniform (or constant), and at least a portion of the gap may be curved (or crooked). When the head portion 139 is curved, a force may be effectively transferred to the mask 20 to control the mask 20 to closely contact the frame 10 corresponding to a shape (or characteristic) of the gap between the frame 10 and the mask 20.

The head portion 139 may be formed to rotate. The head portion 139 may be rotatably disposed at the lower end of the pressing portions 136a, such that a location of the head portion 139 is controlled in the first direction.

According to the exemplary embodiments, the manufacturing apparatus 100 may measure the gap between the frame 10 and the mask 20, and apply a force to the mask 20 such that the mask 20 may contact the frame 10 closely and be affixed to the frame 10. The manufacturing apparatus 100 may control the pressurizing unit 130 to apply different forces to the mask 20 such that the mask 20 may contact the frame 10 closely. Accordingly, the manufacturing apparatus 100 may improve the deposition precision and a production yield by reducing defects of the mask frame assembly by reducing the gap formed between the frame 10 and the mask 20.

FIG. 5, FIG. 6, FIG. 7, and FIG. 8 are cross-sectional views illustrating a method for manufacturing a mask frame assembly according to an exemplary embodiment. Referring to FIGS. 5, 6, 7, and 8, the mask frame assembly may be produced by affixing the mask 20 to the frame 10 using the manufacturing apparatus 100.

The extending unit 120 may extend the both ends (or respective ends) of the mask 20, which includes the one or more deposition patterns, and arrange the mask 20 on the frame 10, which includes the opening. The extending unit 120 may extend the mask 20 in the first direction corresponding to the lengthwise direction to prevent or reduce the sagging or wrinkle of the mask 20. Thereafter, the mask 20 may be arranged on the frame 10 such that the deposition patterns of the mask 20 correspond to the opening of the frame 10.

The gap measuring unit 110 may measure the gap between the frame 10 and the mask 20. When the mask 20 is arranged on the frame 10, an upper surface of the frame 10 and a lower surface of the mask 20 contact each other. The gap may be formed between the frame 10 and the mask 20 due to unevenness on the upper surface of the frame 10 and the lower surface of the mask 20 generated during a manufacturing process, and thus, the frame 10 and the mask 20 may not closely contact each other.

The gap measuring unit 110 may be installed or disposed above the mask 20 to measure the gap by using the path difference of lights respectively reflected from the frame 10 and the mask 20. The gap measuring unit 110 may be connected to the control unit 150 to transmit the measured gap data to the control unit 150. The measured gap data corresponds to the measured gap.

The control unit 150 may calculate the amount of force applied to the mask 20 by the pressurizing unit 130 from the gap data received from the gap measuring unit 110. The control unit 150 may calculate the amount of force to remove or reduce the measured gap between the frame 10 and the mask 20.

The pressurizing unit 130 may apply different amounts of force to the mask 20 according to a location where the mask 20 contacts the frame 10. The pressurizing unit 130 may apply the different amounts of force to the mask 20 correspond to the gap between the frame 10 and the mask 20 such that the mask 20 closely contacts the frame 10.

The control unit 150 may control the pressurizing unit 130 to apply the calculated force to the mask 20. The control unit 150 may control a driving force transferred to the pressing portions 136 from the driving portion 138.

The pressurizing unit 130 may include a plurality of pressing portions 136, and each of the plurality of pressing portions 136 may independently apply the corresponding forces to the mask 20. The pressurizing unit 130 may independently transfer the driving forces from the driving portion 138 to the respective pressing portions. One of the plurality of pressing portions 136 may apply a amount of force to the mask 20, which is different from other forces applied by another of the plurality of pressing portions 136 disposed adjacent to the one of the plurality of pressing portion 136.

The welding unit 140 may weld the mask 20 to affix the mask 20 to the frame 10. The welding unit 140 may weld the mask 20 along the frame 10 inside the pressurizing unit 130. The mask 20 may be formed flat in the first direction, and the frame 10, the mask 20 may closely contacted to each other in the second direction by the pressurizing unit 130, and the mask 20 may be affixed to the frame 10.

According to the exemplary embodiments, the manufacturing method for the mask frame assembly may measure the gap formed between the frame 10 and the mask 20 and apply an amount of force corresponding to the gap such that the mask 20 is affixed to the frame 10 while the mask 20 closely contacts the frame 10. In the manufacturing method for the mask frame assembly, the pressurizing unit 130 may apply different amounts of force to the mask 20 to press the mask 20 toward the frame 10 such that the mask 20 closely contacts the frame 10. According to the manufacturing method for the mask frame assembly, adhesion of the frame 10 and the mask 20 is improved, and a defect of the mask frame assembly is decreased and the production yield and the deposition precision may be improved.

Figure 9:
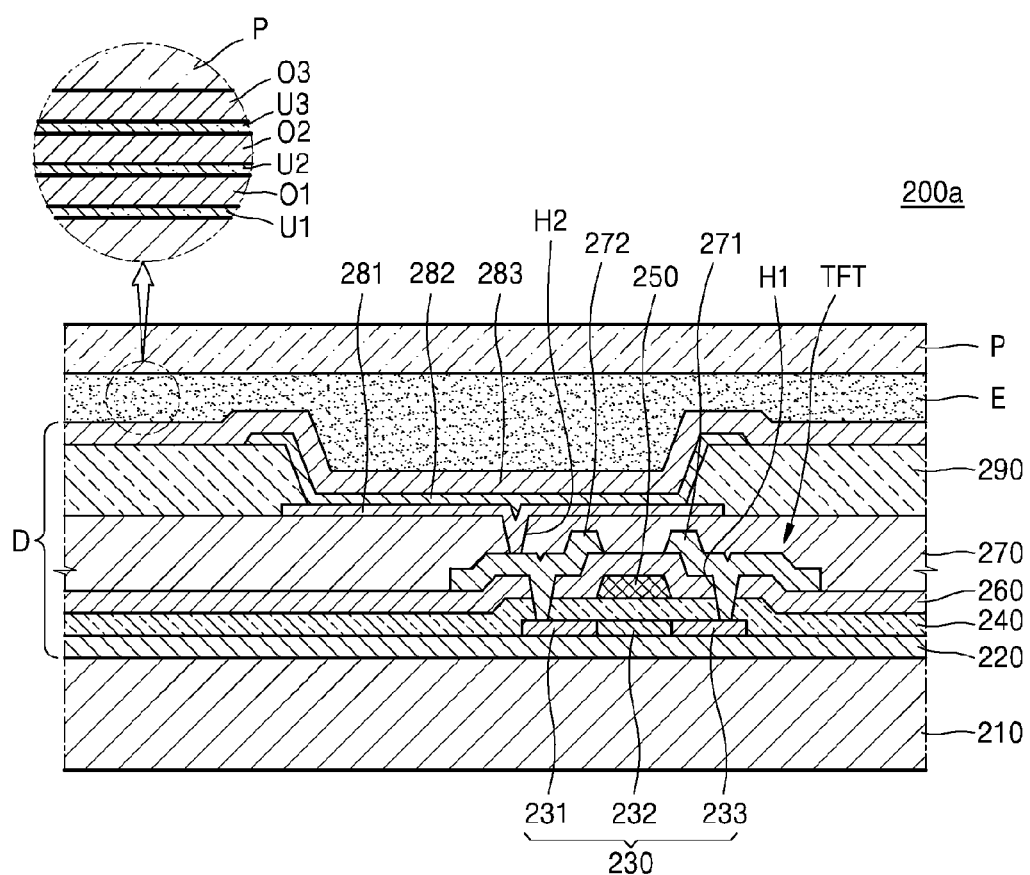
FIG. 9 is a cross-sectional view illustrating a sub-pixel of a display apparatus manufactured using a manufacturing apparatus for a mask frame assembly according to the exemplary embodiments.

FIG. 9 is a view illustrating a sub-pixel of a display apparatus 200a manufactured using the manufacturing apparatus 100 for the mask frame assembly illustrated in FIGS. 1 through 8 according to another embodiment.

In an exemplary embodiment, the sub-pixel may include at least one thin film transistor (TFT) and an organic light emitting display device (OLED). A thin film transistor may according to the exemplary embodiments is not limited to the structure illustrated in FIG. 9, and the number and structure of the thin film transistor may be changed. Referring to FIG. 9, the display apparatus 200a may include a substrate 210, a display portion D, an encapsulation portion E, and a protection layer P.

According to an exemplary embodiment, the substrate 210 may be a flexible insulation material. For example, the substrate 210 may be a high polymer substrate, such as polyimide (PI), polycarbonate (PC), polyethersulphone (PES), polyethylene terephthalate (PET), polyethylene naphthalate (PEN), polyarylate (PAR), fiber glass reinforced plastic (FRP), and so on. The substrate 210 may be a glass substrate having a thickness to be bendable. The substrate 210 may be a metal. The substrate 210 may be transparent, translucent, or opaque.

A buffer layer 220 may be disposed on an upper surface of the substrate 210. The buffer layer 220 may include an organic compound and/or an inorganic compound. The buffer layer 220 may prevent or reduce oxygen and moisture and flatten a surface of the substrate 210.

The buffer layer 220 may include at least one of organic compounds of acryl, polyimide, and polyester, or inorganic compounds of silicon oxide ($SiO_2$), silicon nitride ($SiN_X$), silicon oxynitride ($SiO_XN_Y$), aluminum oxide ($AlO_X$), and aluminum oxynitride ($AlO_XN_Y$).

A thin film transistor may be formed on the buffer layer 220. The thin film transistor may be referred to as a top gate transistor. However, an exemplary embodiment is not limited thereto. The thin film transistor may be a bottom gate transistor having a different structure.

After an active layer 230 is arranged with a predetermined pattern on the buffer layer 220, the active layer 230 is covered by a gate insulation layer 240. The active layer 230 may include a source area 231, a drain area 233 and a channel area 232 between the source area 231 and the drain area 233.

The active layer 230 may include various materials. For example, the active layer 230 may include an inorganic semiconductor material such as amorphous silicon or crystalline silicon. The active layer 230 may also include an oxide semiconductor including at least one of a metal from element groups 12, 13, and 14, such as Zinc (Zn), Indium (IN), Gallium (Ga), Tin (Sn), Cadmium (Cd), Germanium (Ge), Hafnium (Hf) and an oxide compound of the such metal. Hereinafter, for the purpose of description, the active layer 230 including amorphous silicon will be explained hereinafter.

A gate electrode 250 corresponding to the active layer 230 and a gate insulation layer 240 covering the gate electrode 250 are disposed on an upper surface of the gate insulation layer 240.

A contact hole H1 is formed in the interlayer insulation layer 260 and the gate insulation layer 240, exposing at least a part of the source area 231 and the drain area 233, and a source electrode 271 and a drain electrode 272 are disposed on the interlayer insulation layer 260 contacting the source area 231 and the drain area 233, respectively, through the contact H1.

A passivation layer 270 is disposed on the thin layer transistor TFT, and a pixel electrode 281 of the OLED is disposed on the passivation layer 270.

The pixel electrode 281 may be a transparent (or translucent) electrode or a reflective electrode. The transparent (or translucent) electrode may be formed with at least one of indium tin oxide (ITO), indium zinc oxide (IZO), zinc oxide (ZnO), indium oxide ($In_2O_3$), indium gallium oxide (IGO), and aluminum zinc oxide (AZO). The reflective electrode may be formed with at least one of Silver (Ag), Magnesium (Mg), Aluminum (Al), Platinum (Pt), Palladium (Pd), Gold (Au), Nickel (Ni), Neodymium (Nd), Iridium (Ir), Chromium (Cr), and a compound thereof, and a layer formed with ITO, IZO, ZnO or $IN_2O_3$. However, an exemplary embodiment is not limited thereto. A structure and a material of the pixel electrode 281 may be changed variously.

The pixel electrode 281 contacts the drain electrode 272 of the thin layer transistor through a via-hole H2 formed in the passivation layer 270. The passivation layer 270 may include an inorganic compound and/or an organic compound, formed of a single layer or two or more layers. The passivation layer 270 may be a flattening layer having an upper surface which is flat regardless of a curvature of the lower surface, or a layer having the upper surface with the same curvature as the lower surface. The passivation layer 270 may be a transparent insulation material to achieve micro-cavity effect.

After the pixel electrode 281 is formed on the passivation layer 270, a pixel defining layer 290 is formed to cover the pixel electrode 281 and the passivation layer 270. The pixel defining layer 290 may include an inorganic compound and/or an organic compound, and may have an opening exposing the pixel electrode 281.

An intermediate layer 282 and a counter electrode 283 are disposed on the pixel electrode 281. The pixel electrode 281 may function as an anode and the counter electrode 283 may function as a cathode, but the polarities of the pixel electrode 281 and the counter electrode 283 may have reversed.

The pixel electrode 281 and the counter electrode 283 are insulated from each other by the intermediate layer 282, and are respectively configured to apply voltages having opposite polarities to the intermediate layer 282.

The intermediate layer 282 may include an organic light emission layer. The intermediate layer 282 may further at least one of a hole injection layer (HIL), a hole transport layer (HTL), an electron transport layer (ETL), and an electron injection layer (EIL). The organic light emission layer included in the intermediate layer 282 is configured to emit light corresponding to the voltage applied by the pixel electrode and the counter electrode 283.

According to the exemplary embodiment, a light emitting material is separately included in the respective pixels in the organic light emission layer, but the exemplary embodiments are not limited thereto. The organic light emission layer may be a common organic light emission layer disposed on the entire surface regardless of the pixels. The organic light emission layer may include multiple layers including light emitting materials to respectively emit different color light, for example, red light, green light, and blue light, vertically stacked in a vertical direction or disposed in a mixed manner. The organic light emission layer may include light emitting materials to emit a combination of different colors as long as a white light may be produced. A color conversion layer or a color filter may be further included to convert the emitted white light to a certain color.

After the display portion D is formed on the substrate 210, the encapsulation layer E may be disposed on the display portion D. The encapsulation layer E may include a plurality of inorganic layers or may include an inorganic layer and/or an organic layer.

The encapsulation layer E may include a high polymer. The encapsulation layer E may be a single layer or stacked layers formed with at least one of polyethylene terephthalate (PET), polyimide (PI), polycarbonate (PC), epoxy, polyethylene, and polyacrylate. The organic layer may include polyacrylate. The organic layer may be a layer polymerized from monomer compounds including a di-acrylate-based monomer and a tri-acrylate-based monomer. The monomer compounds may include a mono-acrylate-based monomer. The monomer compounds may include a photoinitiator, such as thermoplastic polyolefin (TPO), but, the exemplary embodiments are not limited thereto. The monomer compounds may include epoxy, (PI), polyethylene terephthalate (PET), polycarbonate (PC), polyethylene, and polyacrylate.

The inorganic layer of the encapsulation layer E may be a single layer or stacked layers having metal oxide or oxynitride. The inorganic layer may be one of silicon oxide ($SiO_2$), silicon nitride ($SiN_x$), aluminum oxide ($Al_2O_3$), titanium oxide ($TiO_2$), zirconium oxide ($ZrO_x$), and zinc oxide (ZnO).

The encapsulation layer E includes an uppermost surface exposed to outside, and the uppermost surface may be formed with an inorganic layer to protect an organic light emission element from introduction of moisture from the outside.

The encapsulation layer E may include at least one sandwich-like structure having at least one organic layer disposed between the inorganic layers. According to an exemplary embodiment, the encapsulation layer E may include at least one sandwich-like structure having at least one inorganic layer disposed between the organic layers. For example, the encapsulation layer E may include a first inorganic layer U1, a first organic layer O1, a second inorganic layer U2, a second organic layer O2, a third inorganic layer U3, and a third organic layer O3, sequentially disposed on an organic light emission device OLED.

A halogenated metal layer (not shown) having a metal fluoride, such as lithium fluoride LiF, may be further included between the display portion D and the first inorganic layer U1. The halogenated metal layer may be formed using a sputtering method to prevent or reduce the organic light emission device from be damaged.

The first organic layer O1 may have an area smaller than the second inorganic layer U2, and the second organic layer O2 may have an area smaller than the third inorganic layer U3.

Here, the encapsulation layer E is not limited to the exemplary embodiment described above. The encapsulation layer E may include a structure having the inorganic layer and the organic layer stacked in various forms.

A protection layer P may be formed on the encapsulation layer E. The protection layer P may be formed using various methods. For example, the protection layer P may be formed using a sputtering method, an ion beam deposition method, an evaporation method, or a chemical vapor deposition method.

The protection layer P may include metallic oxide or nitride, such as silicon nitride ($SiN_x$), silicon oxynitride ($SiO_xN_y$), titanium oxide ($TiO_x$), titanium nitride ($TiN_x$), titanium oxynitride ($TiO_xN_y$), zirconium oxide ($ZrO_x$), tantalum nitride ($TaN_x$), tantalum oxide ($TaO_x$), hafnium oxide ($HfO_x$), and aluminum oxide ($AlO_x$).

The protection layer P may be formed to cover entire sides of the encapsulation layer E. Accordingly, the protection layer P may prevent or reduce moisture and/or oxygen from being introduced into the encapsulation layer E, and may extend or improve a life span of the encapsulation layer E.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:

1. An apparatus for manufacturing a mask frame assembly, comprising:
   an extending unit configured to extend both ends of a mask in a first direction and arrange the mask on a frame, the mask comprising a deposition pattern and the frame comprising an opening;
   a pressurizing unit comprising a plurality of pressing portions, each of the plurality of pressing portions configured to independently press the mask toward the frame and configured to apply separately adjusted amounts of force; and
   a welding unit configured to weld the mask to affix the mask onto the frame.

2. The apparatus of claim 1, wherein each of the plurality of pressing portions of the pressurizing unit are configured to apply different amounts of force to the mask according to a location at which the mask contacts the frame.

3. The apparatus of claim 1, further comprising:
   a gap measuring unit disposed above the mask, the gap measuring unit configured to measure a gap between the mask and the frame.

4. The apparatus of claim 3, wherein each of the plurality of pressing portions of the pressurizing unit are configured to press the mask according to the gap measured by the gap measuring unit.

5. The apparatus of claim 1, wherein the pressurizing unit further comprises a driving portion configured to independently transfer a driving force to the respective pressing portions.

6. The apparatus of claim 5, wherein the plurality of pressing portions are configured to linearly move in a second direction, the second direction being different from the first direction.

7. The apparatus of claim 1, wherein the pressurizing unit further comprises a head portion connected to each end portion of the plurality of pressing portions, the head portion contacting the mask.

8. The apparatus of claim 7, wherein the head portion is rotatably connected to each end portion of the plurality of pressing portions.

9. An apparatus for manufacturing a mask frame assembly, comprising:
- an extending unit configured to extend both ends of a mask in a first direction and arrange the mask on a frame, the mask comprising a deposition pattern and the frame comprising an opening;
- a gap measuring unit configured to measure a gap between the mask and the frame;
- a pressurizing unit configured to apply different amounts of force to the mask in response to the gap measured by the gap measuring unit; and
- a welding unit configured to weld the mask to affix the mask onto the frame.

10. The apparatus of claim 9, further comprising:
a control unit configured to:
- receive gap data generated by the gap measuring unit in response to the measured gap between the mask and the frame; and
- control the pressurizing unit to apply the different amounts of force to the mask in response to the gap data.

11. The apparatus of claim 10, wherein the pressurizing unit comprises:
- a plurality of pressing portions configured to press the mask in a second direction, the second direction being different from the first direction; and
- a driving portion configured to independently transfer a driving force to the pressing portions in response to the received gap data.

12. The apparatus of claim 11, wherein the pressurizing unit further comprises:
- a head portion connected to each of the plurality of pressing portions, the head portion contacting the mask.

13. The apparatus of claim 11, wherein the plurality of pressing portions configured to linearly move in the second direction.

* * * * *